(12) United States Patent
Hashimoto

(10) Patent No.: US 6,274,405 B1
(45) Date of Patent: *Aug. 14, 2001

(54) SEMICONDUCTOR DEVICE, METHOD OF MAKING THE SAME, CIRCUIT BOARD, AND FILM CARRIER TAPE

(75) Inventor: Nobuaki Hashimoto, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/077,804

(22) PCT Filed: Sep. 29, 1997

(86) PCT No.: PCT/JP97/03458

§ 371 Date: Jun. 15, 1998

§ 102(e) Date: Jun. 15, 1998

(87) PCT Pub. No.: WO98/18161

PCT Pub. Date:Apr. 30, 1998

(30) Foreign Application Priority Data

Oct. 17, 1996 (JP) .................................... 8-297531

(51) Int. Cl.$^7$ .................................................. H01L 23/28
(52) U.S. Cl. ........................ 438/110; 438/111; 438/127; 438/112; 257/669; 257/672; 257/674
(58) Field of Search ................................... 438/110, 127, 438/111, 112, 125, 126; 257/668, 700, 704, 669, 672, 674, 787; 361/760, 772, 777

(56) References Cited

U.S. PATENT DOCUMENTS

| | | | |
|---|---|---|---|
| 5,166,099 | * 11/1992 | Ueda et al. ........................ | 437/220 |
| 5,338,973 | * 8/1994 | Yoshigai ........................... | 257/668 |
| 5,357,400 | * 10/1994 | Takekawa .......................... | 361/704 |
| 5,686,757 | * 11/1997 | Urushima .......................... | 257/668 |
| 5,892,273 | * 4/1999 | Iwasaki et al. ..................... | 257/690 |
| 5,976,912 | * 11/1999 | Fukutomi et al. .................. | 438/110 |
| 5,990,546 | * 11/1999 | Igarashi et al. .................... | 257/700 |

FOREIGN PATENT DOCUMENTS

| | | |
|---|---|---|
| 3-283440 | 12/1991 | (JP) . |
| 4-260342 | 9/1992 | (JP) . |
| 5-6924 | 1/1993 | (JP) . |
| WO 95/08856 | 3/1995 | (WO) . |

* cited by examiner

*Primary Examiner*—Charles Bowers
*Assistant Examiner*—Laura Schillinger
(74) *Attorney, Agent, or Firm*—Oliff & Berridge, PLC

(57) ABSTRACT

This is a semiconductor device made by using a film carrier tape and method of making the same, wherein the package size is close to the chip size and connection portions for electrodes of a semiconductor chip are not exposed. Electroplating is performed in a state where connection leads 24, plating leads 26 and plating electrodes 28 are all conductive, the connection leads being are formed within a region to be filled with a molding material 36 and being connected to electrodes 42 of a semiconductor chip 40 and pad portions 22, the plating leads 26 being connected to the connection leads 24, and plating electrodes 28 being connected to the plating leads 26. The connection portions 29 are punched out into the region to be filled with the molding material, the connection leads 24 and the electrodes 42 are connected, and the molding material 36 is poured in. The end surfaces of the connection leads 24 that are exposed from the holes 32 are also covered by the molding material 36 so as not to be exposed.

17 Claims, 9 Drawing Sheets

SEMICONDUCTOR DEVICE, METHOD OF MAKING THE SAME, CIRCUIT BOARD, AND FILM CARRIER TAPE

TECHNICAL FIELD

This invention relates to a semiconductor device, a method of making the same, a circuit board, and a film carrier tape and, in particular, to a semiconductor device, a method of making the same, a circuit board, and a film carrier tape in which the package size is close to the chip size.

BACKGROUND OF ART

If high-density mounting of semiconductor devices is to continue, bare-chip mounting would be ideal. However, quality assurance and handling are difficult in the bare chip state. A packaging method called CSP (Chip Scale/Size Package) has been developed to provide a bare-chip package which has a size when packaged that is close to the chip size.

In one of the various forms Of CSP semiconductor device that have been developed, a flexible substrate is provided on an active surface side of a semiconductor chip, and a plurality of external electrodes are formed on this flexible substrate. With this CSP semiconductor device, the external electrodes are provided within the area of the semiconductor chip. This means that there are no "outer leads," which are leads that extend from the side surfaces of the actual package, as in QFP (Quad Flat Package) or TCP (Tape Carrier Package).

In a CSP semiconductor device using a flexible substrate, a known method of absorbing thermal stresses is to inject resin between the active surface of the semiconductor chip and the flexible substrate, as disclosed in International Publication W095/08856, for example. If all of the connection portions for the electrodes of the semiconductor chip are covered by this resin, it is possible to prevent corrosion of the electrodes.

In addition, if a film carrier tape is used when the semiconductor chip is mounted onto the flexible substrate, handling is even easier and mass productivity is also excellent. With this method of using a film carrier tape, individual semiconductor devices are separated from the film carrier after the semiconductor chips have been sealed in resin.

In this case, the wiring formed on the film carrier tape is gold-plated. This gold-plated is implemented by an electroplating (otherwise called "electrolytic plating") method. In the electroplating method, it is usual to make all of the wiring conductive and extend the wiring out of the region on which the semiconductor chip is to be mounted. The extended wiring is used as electrodes for the electroplating. Note that in the prior art there are outer leads, and these outer leads are used as wiring for the electroplating, by extending them without further modification. If an existing type of flexible substrate is used, plating leads for the electroplating are necessary. The plating leads are usually provided connected directly to the connection leads, and a substrate for TAB (Tape Automated Bonding) is known in the art for use in TCP.

However, if an attempt is made to apply this existing TAB substrate without modification to a CSP type of semiconductor device, the connection leads are connected directly without modification to the plating leads, so that the end surfaces of the leads are exposed from the end surfaces of the package and thus the end surface portions of the leads are inevitably exposed. In a CSP semiconductor device, the external shape of the package is close to the chip size, so that the distance between the outer form of the chip and the outer form of the package is extremely small. Therefore, even if the semiconductor chip is protected by packaging it, it is necessary to make the reliability of the semiconductor chip higher under any surroundings than that of the prior-art package. In particular, if the previously described prior-art configuration is used without modification for a CSP type of semiconductor device, the configuration is such that the distance from the cut surfaces of the leads to the electrodes of the semiconductor chip is extremely short and, moreover, the end portions of the leads are not covered by anything to be exposed, so that corrosion can easily progress along the leads to the electrodes. In addition, the pitch between adjacent leads is becoming increasingly tight, so it is inevitable that causes such as the presence of conductive impurities on the exposed out surfaces will result in short of the leads, destroying the functions of the device.

On the other hand, this problem can be avoided if the semiconductor devices are separated individually from the film carrier tape and then resin is injected therein. However, this means that loose semiconductor devices have to be handled individually, so that the advantages of the method of using a film carrier tape cannot be realized.

This invention was devised in order to solve the above described problems and has as its objective the provision of a semiconductor device made by using a film carrier tape, in which the package size is close to the chip size, in a configuration for preserving the reliability of the semiconductor chip. In addition, it provides a method of making the same, a circuit board for enclosing the same, and a film carrier tape.

DISCLOSURE OF INVENTION

A method of making a semiconductor device in accordance with this invention is a method of making a resin-sealed type semiconductor device in which a flexible substrate having a plurality of connection leads is used, where one end portion of each of the connection leads is used for connection to one of electrodes of a semiconductor chip and the other end portion thereof is used for connection to an exterior, the method comprising:

a first step of positioning a part of a film carrier tape corresponding to the flexible substrate above the semiconductor chip, and also positioning the one end portion and the other and portion of each of the connection leads within a region of the semiconductor chip;

a second step of connecting the one end portion of each of the connection leads to one of the electrode of the semiconductor chip, after the first step;

a third step of sealing in resin an active surface of the semiconductor chip that comprises the connected electrodes and an area that comprises the one end portion of each of the connection leads, after the second step; and a fourth step of separating an individual piece from the film carrier tape, after the third step.

In this case, the fourth step is preferably performed outside the resin-sealed region.

In addition, the method could further comprise a step of forming the film carrier tape, before the first step.

This step of forming the film carrier tape could comprise:

a step of forming a conductive pattern on a film, the conductive pattern electrically comprising all of the connection leads, a plurality of connection portions, at least one plating lead and a plating electrode in an electrically conductive state, the connection leads being formed within the region to be sealed in the resin and electrically connecting the electrodes to the exterior, each of the connection portions being connected to one of the connection leads and extending to outside the resin-sealed region, the plating lead being connected to the connection portions outside the resin-sealed region, and the plating electrode being connected to the plating lead;

a step of performing electroplating on the conductive pattern, through the plating electrode; and a step of punching out at least part of each of the connection portions.

This ensures that the connection leads for connecting the electrodes of the semiconductor chip to the exterior are formed within the resin-sealed region. The package size can therefore be made to be close to the chip size. Since It can be applied to the making of a semiconductor chip using a film carrier tape, it facilitates the handling thereof.

When electroplating is performed on the connection leads, the plating leads and plating electrodes are used. In other words, the connection leads, connection portions, Plating leads, and plating electrodes are all in a conductive state, so that electroplating of the connection leads can be performed through the connection leads.

Note that if portions other than those to be electroplated are covered with resist, making it possible to reduce wastage of the plating materials. The portions to be plated in this manner are, more specifically, the connection leads or lands.

In this case, at least part of each connection portion is punched out within the resin-sealed region. Therefore, if resin-sealing is performed, the end surfaces formed by this punching will be covered with resin. This prevents corrosion of the connection leads from these end surfaces, and also makes it possible to prevent corrosion of the electrodes of the semiconductor chip. This means that the package has excellent capabilities even in a high-humidity environment, improving reliability.

Since the film carrier tape is eventually punched out at a position outside the resin-sealed region, there are no protrusions of the resin along the outer periphery of the completed semiconductor device. This makes it possible to ensure straight lines for the external form.

A plurality of these connection portions could be punched out in a single batch, reducing the number of steps.

A method of making a film carrier tape in accordance with this invention comprises a step of forming a conductive pattern on a film, the conductive pattern electrically comprising all of a plurality of connection leads, at least one plating lead and a plating electrode in an electrically conductive state, the connection leads being formed within a region to be sealed and electrically connecting electrodes of a semiconductor chip to external electrodes, the plating lead being connected to the connection leads formed to outside the sealed region, and the plating electrode being connected to the plating lead.

Alternatively, the method of making a film carrier tape in accordance with this invention comprises:

a step of forming lead holes in a film;

a step of providing a metal foil over a region of the film comprising the lead holes;

a step of forming a conductive pattern comprising pad portions, connection leads, a plating lead, a plating electrode, and connection portions, from the metal foil;

a step of plating the conductive pattern through the plating electrode; and a step of processing the connection portions to form a wiring pattern.

In this case, the step of forming the wiring pattern could be performed by punching out the connection portions.

In addition, a plurality of these connection portions could be punched out in a single batch, reducing the number of steps.

Alternatively, this punching could be performed for each connection portion.

Each connection portion could be punched out by a circular hole.

Alternatively, this circular hole could have an oval shape, such that the major-axial direction of the oval shape is aligned substantially perpendicular to a side forming the outer periphery of the semiconductor device.

A protective film could also be provided on a region of the conductive pattern that excludes regions to be subjected to the plating, before the step of executing plating.

A resin could be used as this protective film.

A solder resist could be used as this resin.

A semiconductor device in accordance with this invention comprises: a semiconductor chip having a plurality of electrodes; a flexible substrate positioned above the semiconductor chip, at a predetermined distance therefrom, and also overlaying the semiconductor chip; and resin positioned between the semiconductor chip and the flexible substrate and sealing a surface of the semiconductor chip having the electrodes; and a plurality of connection leads on the flexible substrate, one end portion of each connection lead being connected to one of the electrodes of the semiconductor chip and the other end portion thereof being used for connection to the exterior; wherein:

the connection leads are positioned such that the one end portion and the other end portion are within a region sealed by the resin, one of the end portions is positioned close to the outer periphery of the semiconductor chip, and also the resin completely covers the region up to a side surface portion.

In this case, holes of either a circular shape or an oval shape could be provided in the flexible substrate at positions at which the end portions of the connection leads are completely covered with the resin.

In a circuit board in accordance with this invention, the above semiconductor device is electrically connected thereto by pad portions of the semiconductor device.

A film carrier tape used in a resin-sealed type of semiconductor device in accordance with this invention comprises:

pad portions on which external electrodes are formed within a region to be sealed in resin, the pad portions being electroplated;

a plurality of connection leads disposed within the region to be sealed in the resin, each of the connection leads connecting each of the external electrodes to each of electrodes of a semiconductor chip, the connection leads being electroplated;

at least one plating lead formed outside the resin-sealed region, the plating lead being electroplated;

a plurality of connection portions electrically connecting the plating lead to ones of the connection leads excluding at least one, the connection portions being electroplated;

at least one hole providing electrical insulation between the excluded one of the connection leads and the plating lead; and plating electrodes connected to the plating lead, the plating electrodes being electroplated.

These holes could be rectangular holes that are formed to extend over a plurality of the connection portions.

Alternatively, a plurality of the holes could be formed, wherein each of the holes is of a circular shape or oval shape and is formed to correspond to one of the connection portions.

Alternatively, these holes could have an oval shape, such that the major-axial direction of the oval shape is aligned substantially perpendicular to a side forming the outer periphery of the semiconductor device.

The formation of the above described holes ensures that the end surfaces of the connection portion are exposed from the holes, and the thus-exposed end surfaces of the connection portions are covered by the resin. This makes it possible to prevent corrosion of the connection leads from the connection portions.

BEST MODE FOR CARRYING OUT THE INVENTION

A preferred embodiment of this invention is described below with reference to the drawings.

Figure 4:
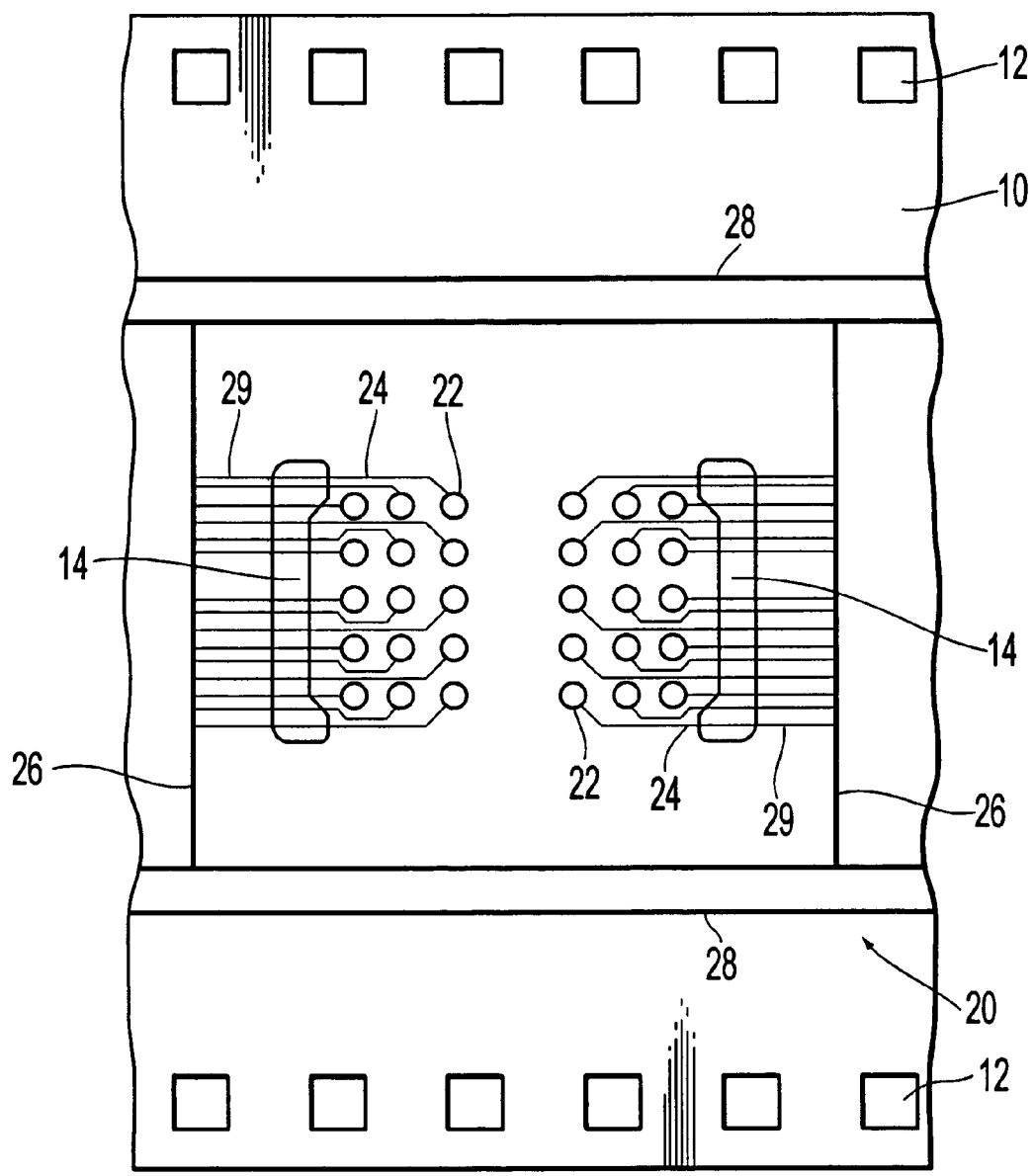
FIG. 4 is an illustrative view of the method of making a semiconductor device in accordance with this embodiment.
Figure 5:
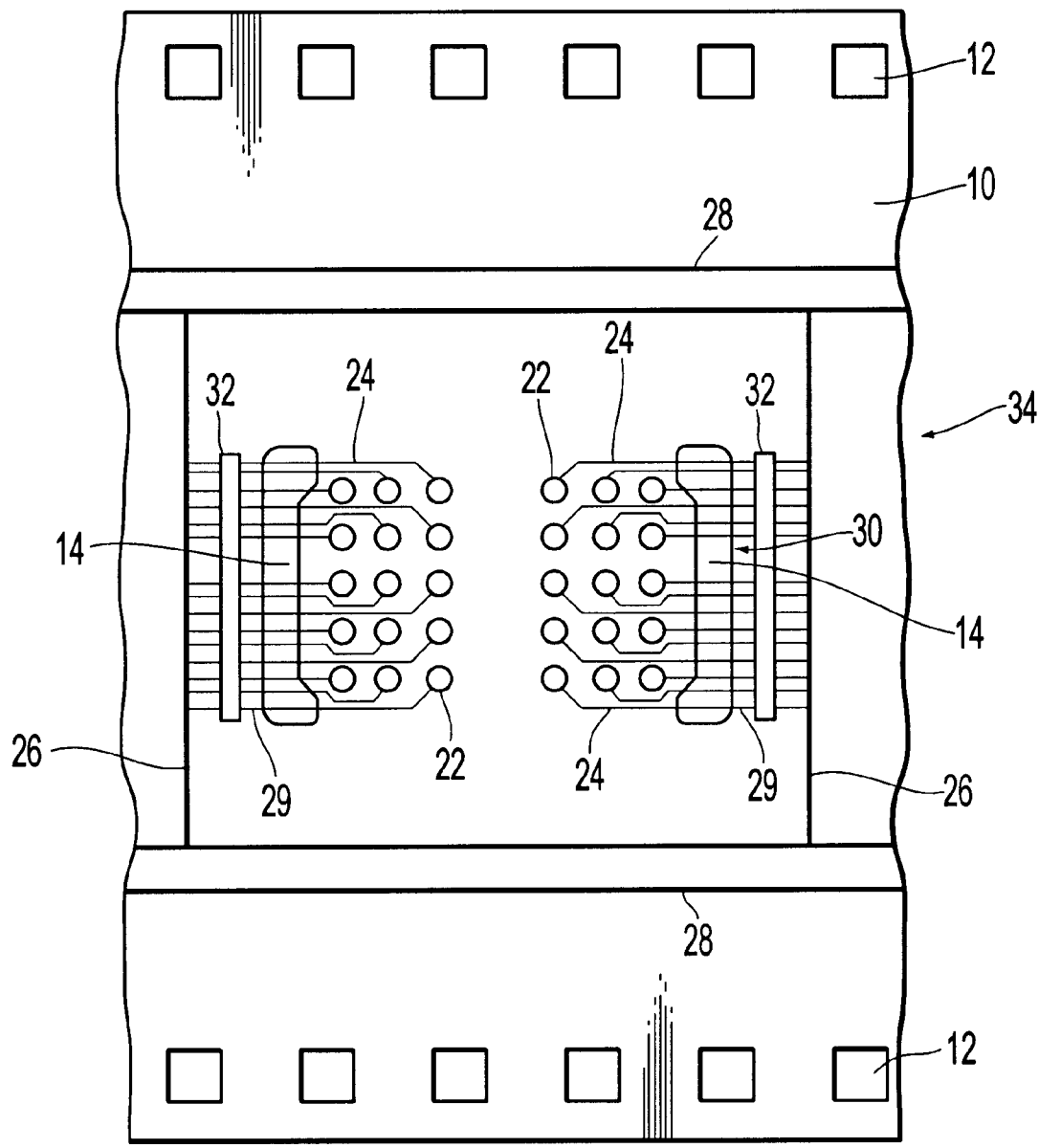
FIG. 5 is an illustrative view of the method of making a semiconductor device in accordance with this embodiment.
Figure 6:
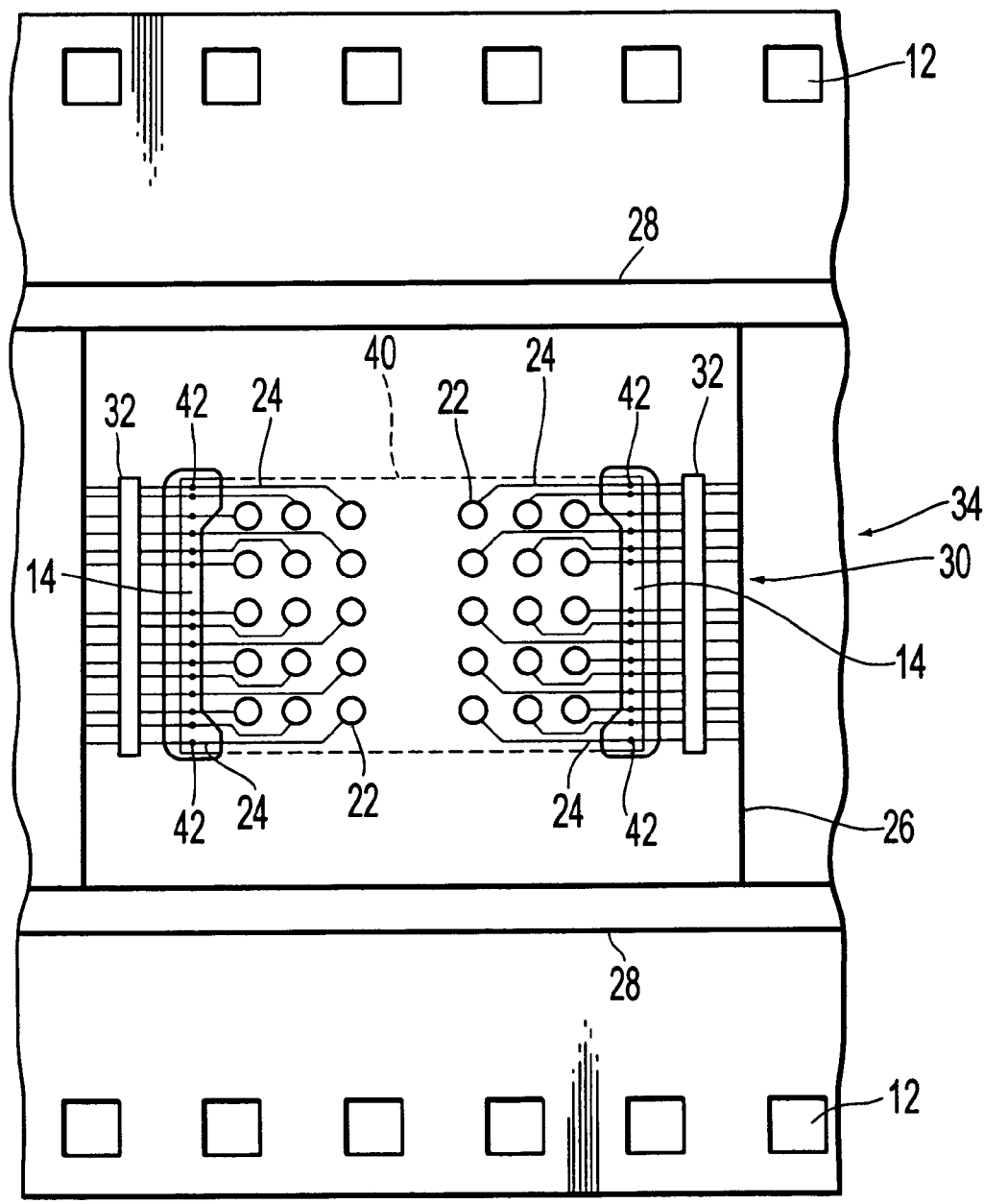
FIG. 6 is an illustrative view of the method of making a semiconductor device in accordance with this embodiment.
Figure 7:
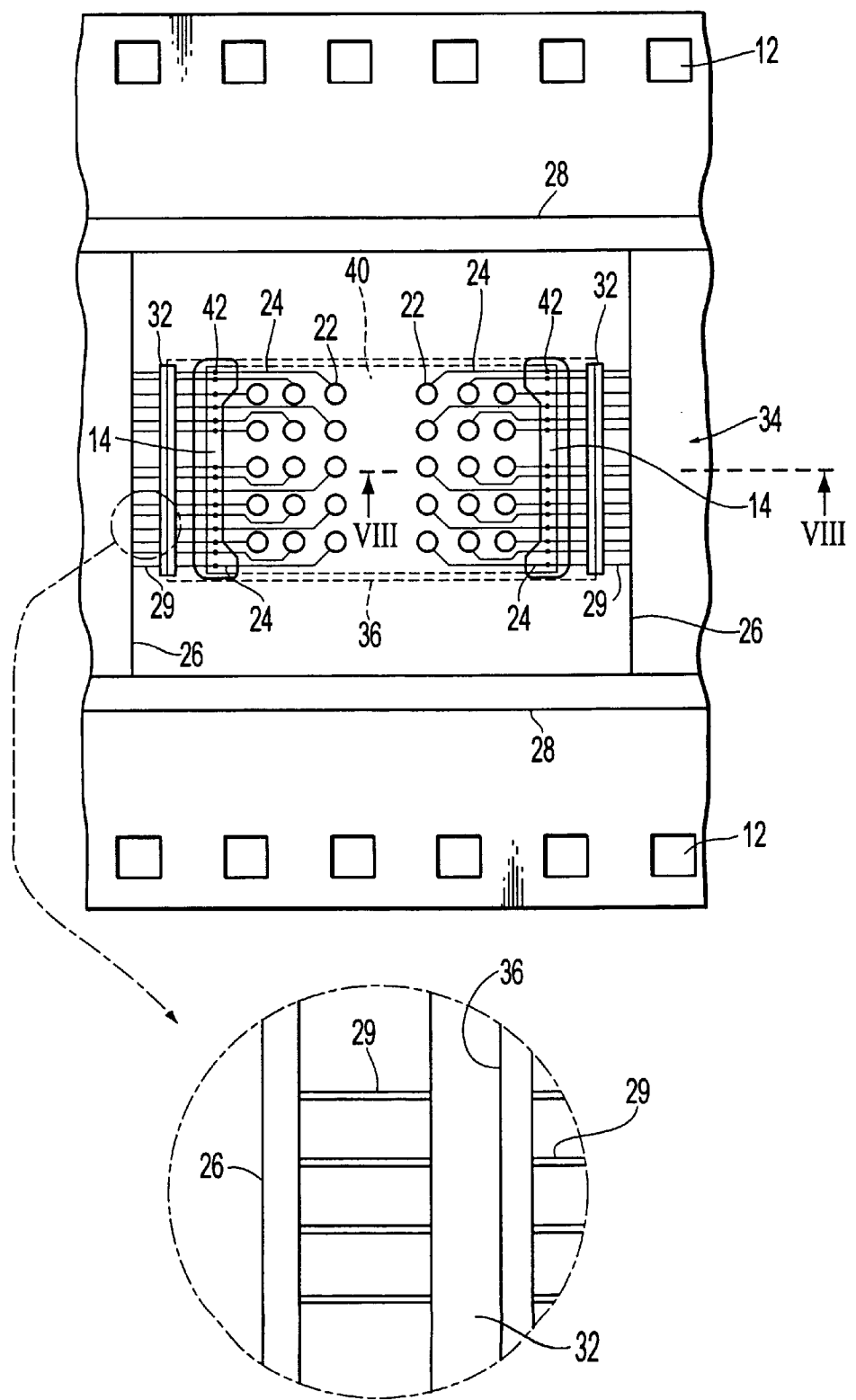
FIG. 7 is an illustrative view of the method of making a semiconductor device in accordance with this embodiment.

Steps in the making of a film carrier tape used in the making of a semiconductor device in accordance with this invention are shown in FIGS. 1 to 7. In particular, FIGS. 1 to 5 illustrate the process of making the film carrier tape and FIGS. 6 and 7 show steps after the bonding of a semiconductor chip to the film carrier tape made by the steps of FIGS. 1 to 5, which do not necessarily follow immediately (sequentially) after the steps shown in FIGS. 1 to 5.

Figure 1:
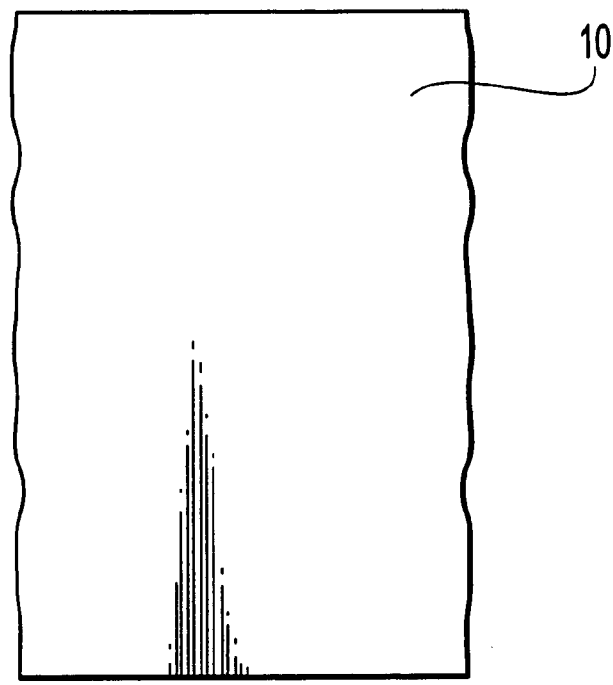
FIG. 1 is an illustrative view of the method of making a semiconductor device in accordance with this embodiment.

First of all, a film 10 that is to act as a base member is prepared, as shown in FIG. 1. The film 10 is in the shape of a tape (long shape) and is formed of a resin such as a polyimide or polyester, with the width thereof being determined by the size of a semiconductor chip (not shown in the figure) that will be mounted thereon. A material that has electrical insulation properties and is also flexible is suitable for this film 10.

Figure 2:
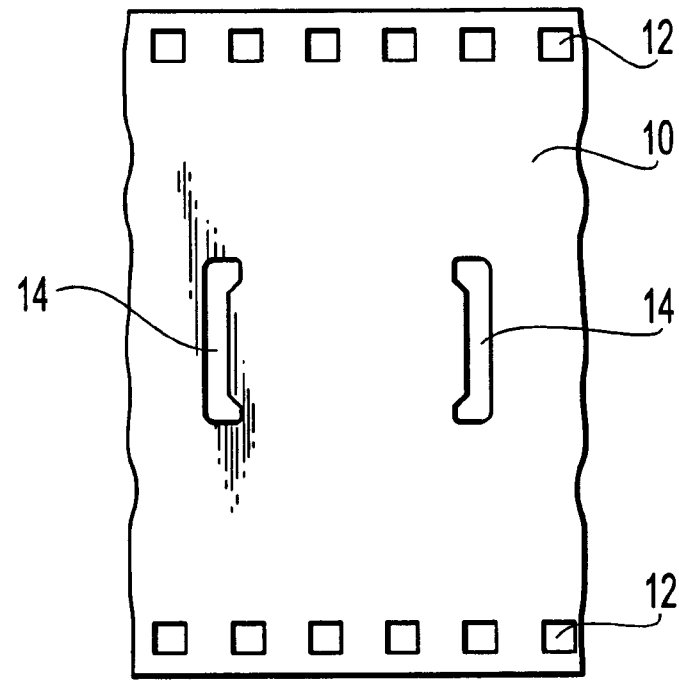
FIG. 2 is an illustrative view of the method of making a semiconductor device in accordance with this embodiment.

Sprocket holes 12 and lead holes 14, as shown in FIG. 2, are formed in this film 10 by a known hole-making technique such as punching, laser-cutting, or chemical etching. The lead holes 14 are formed in regions corresponding to electrodes 42 of a semiconductor chip 40 that will be mounted thereon, as shown in FIG. 6. In other words, the lead holes 14 are formed to enable the bonding of connection leads 24 to the electrodes 42.

Figure 3:
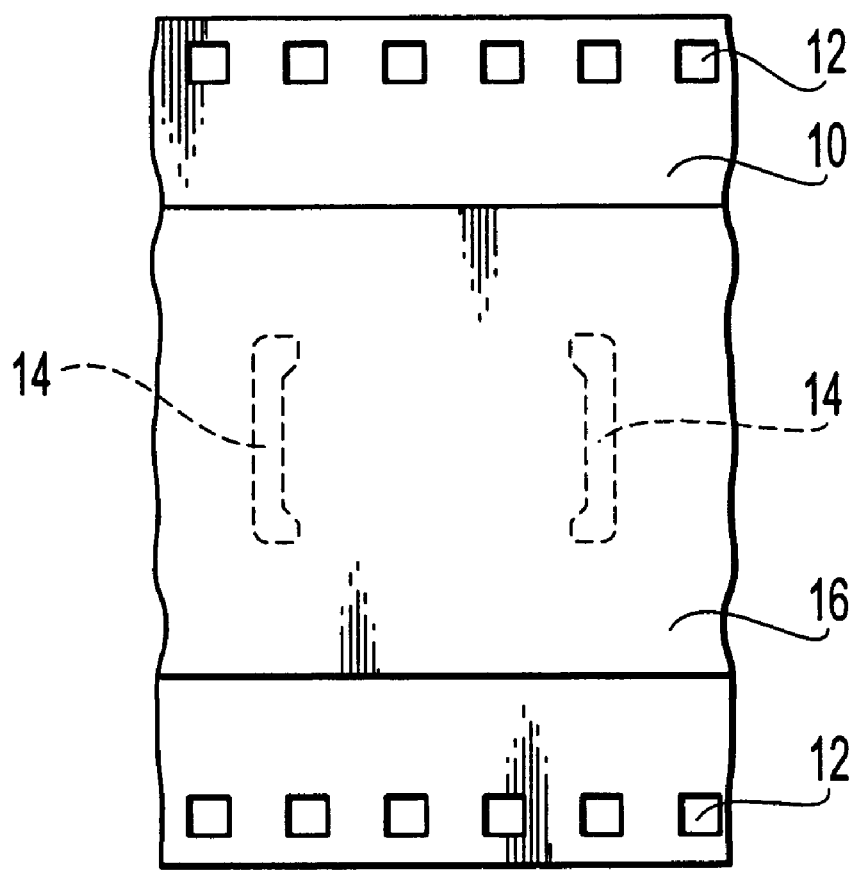
FIG. 3 is an illustrative view of the method of making a semiconductor device in accordance with this embodiment.

An adhesive is then applied to the film 10, and a material that facilitates electrical conduction, such as a metal foil which in this example is copper foil 16, is affixed thereto while being pressed by heat- and pressure-application means such as heat rollers that are not shown in the figures. FIG. 3 shows the state after the copper foil 16 has been affixed to the film 10.

A desired conductive pattern 20 is formed from the copper foil 16 by wet etching, as shown in FIG. 4.

The conductive pattern 20 comprises pad portions 22, the connection leads 24, plating leads 26, plating electrodes 28, and connection portions 29, which are all in an electrically conductive state at this conductive pattern 20 stage. The pad portions 22 are to be provided with bumps, such as solder balls, so that they can function as external electrodes. Therefore, it the pad portions 22 are viewed in plan, the outer surfaces thereof are flat and have a predetermined surface area (which is usually wider than the connection leads 24). Note that the pad portions 22 themselves could be formed to be convex, so that they already function as bumps. These pad portions 22-could also be lands as they are shown in the figure after the semiconductor device is made. However, note that in such a case it would be necessary to provide a connective material such as solder on the side on which the component (substrate) will be attached. When a semiconductor chip has been mounted on the film carrier tape (see FIG. 7), the pad portions 22 are disposed within the region of the semiconductor chip 40 and within a region that will be resin-sealed by a molding material 36.

Each of the connection leads 24 has one end portion connected to a pad portion 22 for forming an external electrode, and is designed to be electrically conductive with respect to the pad portion 22. Note that the connection leads 24 are formed to be narrower than the pad portions 22. Consideration of the narrow pitch inevitably results in the narrow connection leads 22, because only good electrical conductivity is required of their width. This apply not only to the connection leads 24, but also to the connection portions 29 that are on the extended lines along the connection leads 24. The other end portion of each connection lead 24 is passed through (straddles) one of the lead holes 14, as shown in FIG. 4. The parts of the connection leads 24 that are positioned within the lead holes 14 will be connected to the electrodes 42 of the semiconductor chip 40. The connection leads 24 are disposed within the region that will be resin-sealed by the molding material 36 as described later, in the same manner as the pad portions 22 (see FIG. 7). The connection leads 24 are electrically connected to the plating leads 26 through the connection portions 29 that link the sections from the edges of the lead holes 14 on the plating leads 26 sides thereof to the plating leads 26. In this case, the plating leads 26 are formed to be positioned outside of the resin-sealed region. In other words, the connection portions 29 are formed to extend from the connection leads 24 within the resin-sealed region to the plating leads 26 outside of the resin-sealed region. Each of these plating leads 26 is formed in the short-lateral direction of the tape-shaped film 10 and is connected to the plating electrodes 28. The plating electrodes 28 are formed in the long-lateral direction of the tape-shaped film 10. Note that there are a sequence of same conductive patterns connected to the plating electrodes 28 on both sides of the conductive pattern 20 of FIG. 4, although they are not shown in the figure.

The entire conductive pattern 20 is then gold-plated by an electroplating (electrolytic plating) method, through the plating electrodes 28. Note that a plating process using tin or solder other than gold could be used as this plating process A known method can be used therefore, depending on conditions such as the connections At least part of the connection portions 29 positioned between the connection leads 24 and the plating leads 26 (in other words, between the edges of the lead holes 14 on the plating-lead sides thereof and the plating leads 26) is then cut out, as shown in FIG. 5, to form a wiring pattern (circuit pattern) 30 from the conductive pattern 20 of FIG. 4. It does not matter whether the cutting method is a mechanical method or a chemical method, and any known technique can be used therefor. In addition, the thus-cut portions need not be completely punched out; it is sufficient to put the connection leads 24 and the plating leads 26 irr an electrically non-conductive state, that is, turn the end portions of the connection leads 24 alone into free ends, for example, and this can be done by subjecting these portions (or rather, the pattern at those positions) to half-etching or the like. In other words, it is not necessary to completely remove the film 10 acting as a base. The result is a long film carrier tape 34 on which predetermined circuits are formed. Once the wiring pattern 30 has been formed, the connection leads 24 include the sides of the connection portions 29 that are still electrically connected to the pad portions 22, that is, they include the wiring at positions between the lead holes 14 and the holes 32. Note that after the step of forming the wiring pattern 30, the simple term "connection leads" also includes the wiring at positions between the lead holes 14 and the holes 32.

It should be noted that the step of punching out the connection portions 29 is performed after the plating step, but before a stop of bonding with respect to the electrodes 42 of the semiconductor chip 40 (see FIG. 6). In this example, the holes 32 are formed by punching out the connection portions 29. These holes 32 are shown in the figure as being long, narrow rectangular holes, but their shape is not limited thereto. One of a pair of long-lateral edges forming each hole 32 is positioned within the resin-sealed region and the other is positioned outside the resin-sealed region as shown in FIG. 7. The end surfaces of the punched-out connection portions 29 form surfaces that are positioned at longitudinal edges of the holes 32, so that these end portions are exposed on the inner sides of the holes 32. These exposed end surfaces of the connection portions 29 will be covered by the resin, That is to say, in addition to forming the desired circuit, the holes 32 form a structure for insulating the exposed end surfaces of the connection portions 29.

Next, as shown in FIG. 6, the film carrier tape 34 is placed on top of the semiconductor chip 40. More specifically, the part of the film carrier tape that corresponds to a flexible substrate is positioned above the semiconductor chip 40. In this case, when the individual semiconductor device is eventually separated from the film carrier tape 34, the remaining part of the film that acts as a substrate corresponds to a flexible substrate.

The electrodes 42 of the semiconductor chip 40 are positioned to be visible through the lead holes 14 of the film carrier tape 34. The size of the semiconductor chip that is used in this case is irrelevant, provided that the end portions of the semiconductor chip are positioned at locations that are outside the edges that form the inner sides of the lead holes but within the lead hole 14 side of the holes 32, as shown in this figure. The arrangement is such that a predetermined gap is formed between the semiconductor chip 40 and the film carrier tape 34. At this point, the connection leads 24 are positioned so that they are disposed above the electrodes 42 of the semiconductor chip 40. The plurality of electrodes 42 are then bonded to the plurality of connection leads 24 either in a batch or one by one. For this bonding it is preferable that bumps are formed on either the electrodes 42 or the connection leads 24.

Note that, when the semiconductor chip 40 has been arranged on the film carrier tape 34 in this embodiment, the position at which the wiring pattern 30 is formed is on the surface of the film that is on the opposite side from the surface facing the semiconductor chip. It is therefore preferable to apply a resin, such as solder resist, to the outer surface of the wiring pattern 30, to insulate and protect it. Note also that it is possible to cover portions other than those that are to be electroplated with the resin as described above. In this case, the portions to be electroplated are, more specifically, the connection leads and lands. Since this ensures that plating is not applied to unnecessary portions, it makes it possible to reduce wastage of the plating materials. Alternatively, if the wiring pattern 30 is disposed on the side of the film carrier tape 34 facing the semiconductor chip 40, it is possible to omit this step of applying solder resist or the like.

Figure 8:
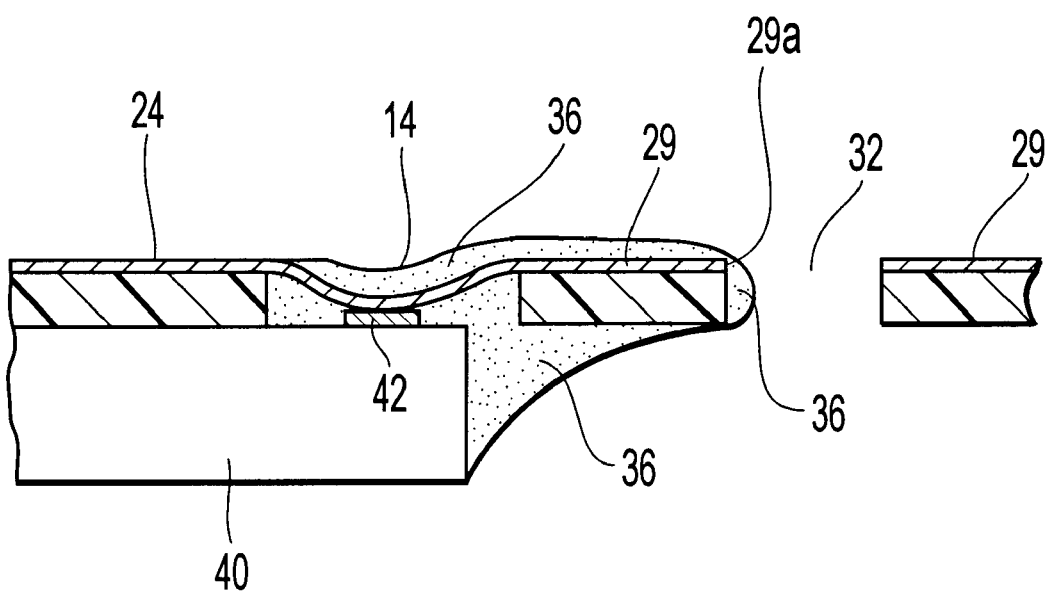
FIG. 8 is a cross-sectional view taken along the line VIII—VIII of FIG. 7.

Next, the semiconductor chip 40 is sealed in with the molding material, as shown in FIG. 7. Note that reference number 36 denotes a region in which the molding material is positioned. A cross-sectional view taken along the line VIII—VIII in FIG. 7 is shown in FIG. 8.

More specifically, the molding material 36 is injected from the lead holes 14 into the gap between the semiconductor chip 40 and the film carrier tape 34. The molding material 36 covers the electrodes 42 ot tne semiconductor chip 40.

The molding material 36 is injected so as to cover end surfaces 29a of the connection portions 29 (that is, the end portions of the connection leads) that are exposed in the holes 32 of the film carrier tape 34. This ensures that the end surfaces 29a of the connection portions 29 (the end portions of the connection leads) that are connected to the electrodes 42 of the semiconductor chip 40 are covered with the resin and thus are not exposed. This is intended to prevent corrosion of the connection leads 24 from the side of the connection portions 29 to the electrodes 42 of the semiconductor chip 40, and also insulate them, so that the reliability of the semiconductor device is increased.

Once this sealing by the molding material 36 is completed, the regions outside the molding material 36 are separated from the film carrier tape 34 that acts as the base material. This separation is done by a batch type of punching, and the portions of the film carrier tape 34 used in the package (in other words, the flexible substrate part thereof) are punched out from the base material of the film carrier tape 34. There are some embodiments with respect to the position of the punching. For example, if the cutting position is within the region of the holes 32 and also outside the resin-sealed region, processing has already been done in the direction in which the wiring pattern extends (the long-lateral direction of the film), so no external force is put during this punching step.

It is also possible to perform the punching further outside than the holes 32, at positions that do not involve the holes, This manner of punching that does not cut through the holes 32 ensures that the eventual outer shape of the semiconductor device has straight lines. This has the advantage of facilitating checks on the external appearance of the semiconductor device in a subsequent step.

Figure 9:
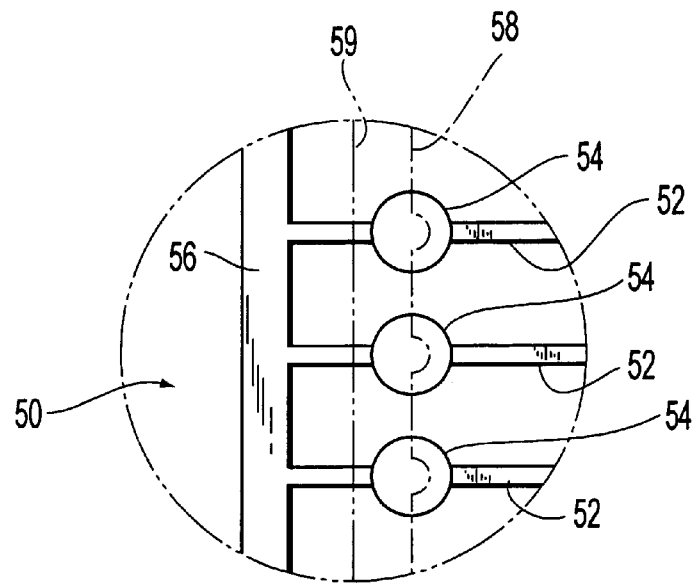
FIG. 9 is a view showing a variant of this embodiment.
Figure 10:
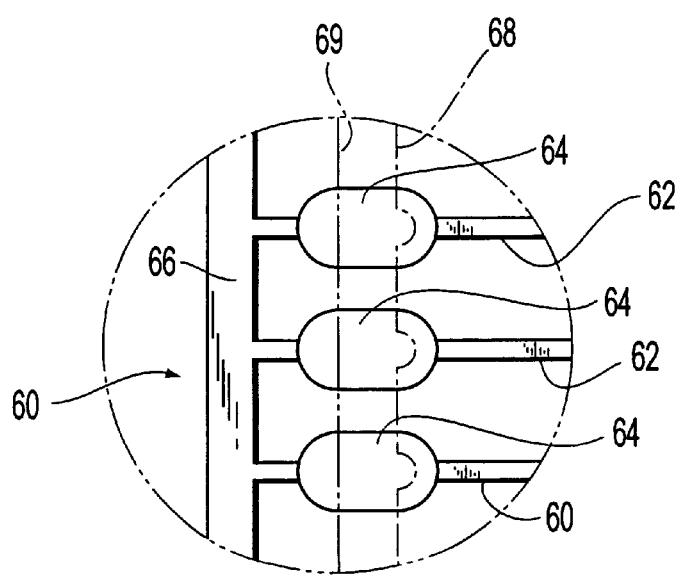
FIG. 10 is a view showing a variant of this embodiment.

FIGS. 9 and 10 are views showing variations of the above embodiment, corresponding to the partial enlarged views in FIG. 7.

In a film carrier tape 50 shown in FIG. 9, each of connection portions 52 is punched out by a circular hole 54 so that they are separated from corresponding plating leads 56. In other words, this circular hole has a diameter that is larger than the width of the connection portion 52. The step of punching out the connection portions 52 is performed after the plating step but before the step of bonding to the electrodes of the semiconductor chip. A circular shape is selected from consideration of the flow characteristics of the resin as well as the adhesive capabilities thereof.

The resin sealing extends as far as the position of a single-dotted line 58, in such a manner that the end surfaces of the connection portions 52 that are exposed from the circular holes 54 are covered by the resin. After that, punching is done at the position of a double-dotted line 59, to complete the semiconductor device. The end portions of the connection leads connected to the electrodes of the semiconductor chip are completely covered with resin. The semiconductor device, thus obtained, achieves the same effects to those of the previous embodiment.

In a film carrier tape 60 shown in FIG. 10, each of connection portions 62 is punched out by an elongated hole 64 so that they are separated from corresponding plating leads 66. The elongated hole is, in other words, an oval shape. The resin sealing extends as far as the position of a single-dotted line 68, in such a manner that the end surfaces of the connection portions 62 that are exposed from the elongated holes 64 are covered. The position of the final punching is shown by a double-dotted line 69, within the inner sides of the elongated holes 64. In other words, the final punching results in a cut-out shape of the elongated holes 64. This completes the semiconductor device. Note that the final punching positions 59 and 69 shown in FIGS. 9 and 10 are not limited thereto. This point will be described below.

In FIG. 10, the major-axial direction of the elongated hole shown in this figure is provided in a direction that is substantially perpendicular to the edge that forms the outer periphery of the package. With this configuration, the boundary surface of the connection portions is positioned further inward from the outer periphery of the package than in the example shown in FIG. 9. The distance up to contact with the atmosphere is therefore further increased, which enables an increase in the effect of preventing corrosion of the leads. In addition, the elongated hole makes it possible to widen the contact region with respect to the resin, further increasing the adhesive strength between the resin and the substrate. In this case, the major-axial direction of the elongated hole is provided in a direction that is substantially perpendicular to the edge that forms the outer periphery of the package, so that the pitch of neighboring connection leads can be made tighter. However, if the pitch restrictions are relaxed to a certain degree, it is not necessary to be concerned about the direction of the major axis of the elongated hole, so it makes no difference whether it is provided in the direction that is substantially perpendicular to the edge that forms the outer periphery of the package, as described above, or in a crossing direction (in other words, aligned in a direction that is substantially parallel to the edge forming the outer periphery of the package).

In addition, in FIGS. 9 and 10, the resin-sealing positions 58 and 68 are placed at a different position from the final punch-out (cutting) positions 59 and 69, more specifically, the cutting (punching) positions are placed further outward from the resin-sealing position as seen from the package, so that the external appearance of the final semiconductor device is straight. This makes it easy to check the external appearance of the semiconductor device in a subsequent step. There is also no danger that the cutting step will damage the resin-sealed portions.

On the other hand, this does not mean that the cutting (punching) position has to be placed at a different position from the resin-sealing position, they could equally well be the same. In addition, the cutting could be done, within the holes, further outward from the position of the resin in the holes. Note that even if the punching position and the resin-sealing position are the same, the punching action is not necessarily done along the outline of the resin drawn into the holes, and the punching can be done along the outermost straight line of the resin-sealed portions. In any case, the end portion of the connection portion connected to the connection lead has a hole (a circular hole, an elongated hole, etc) formed therein, and is provided at a position inward of the end portion of the substrate (film carrier tape), so that the end portion of the connection portion is kept covered with resin.

When plating is done in the above described embodiments, a known non-electrolytic plating method could be used instead of the electrolytic plating. In addition, the film carrier tape itself is not limited to the three-layer tape of conductive pattern, adhesive, and film, as in these examples; a two-layer tape without the adhesive of the above structure could also be used therefor.

Note that a chip formed to have electrodes along its two sides is used in the above embodiments, but it should be obvious that this invention can also be applied in the same manner to a chip in which electrodes are provided along its four sides. In such a case, the rectangular holes would be provided in four directions on the tape.

The above examples were described as relating to a fan-in type of structure in which the external electrodes are drawn inward towards the inner side of the semiconductor chip region, but it is also possible to apply this invention to a structure that combines the fan-in type with the opposite thereof, a fan-out type. In such a case, these examples can be used for the fan-in type, and prior techniques can be used for the fan-out type.

Figure 11:
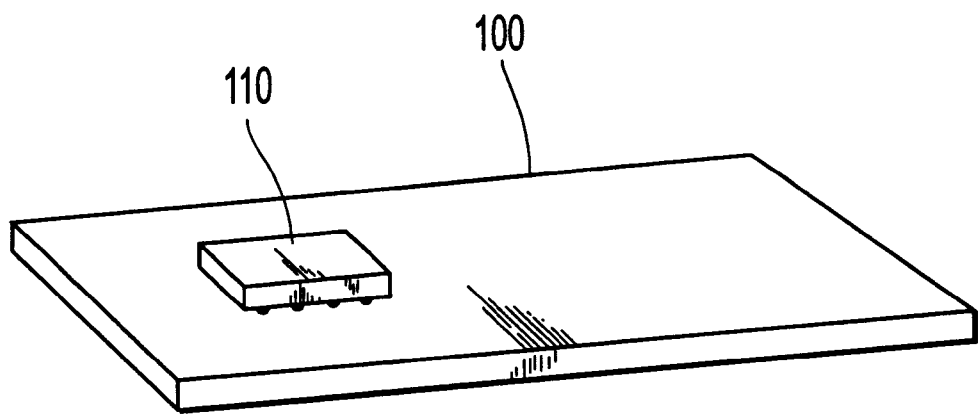
FIG. 11 is a view showing a circuit board on which a semiconductor device made by the application of this embodiment is mounted.
Figure 4:
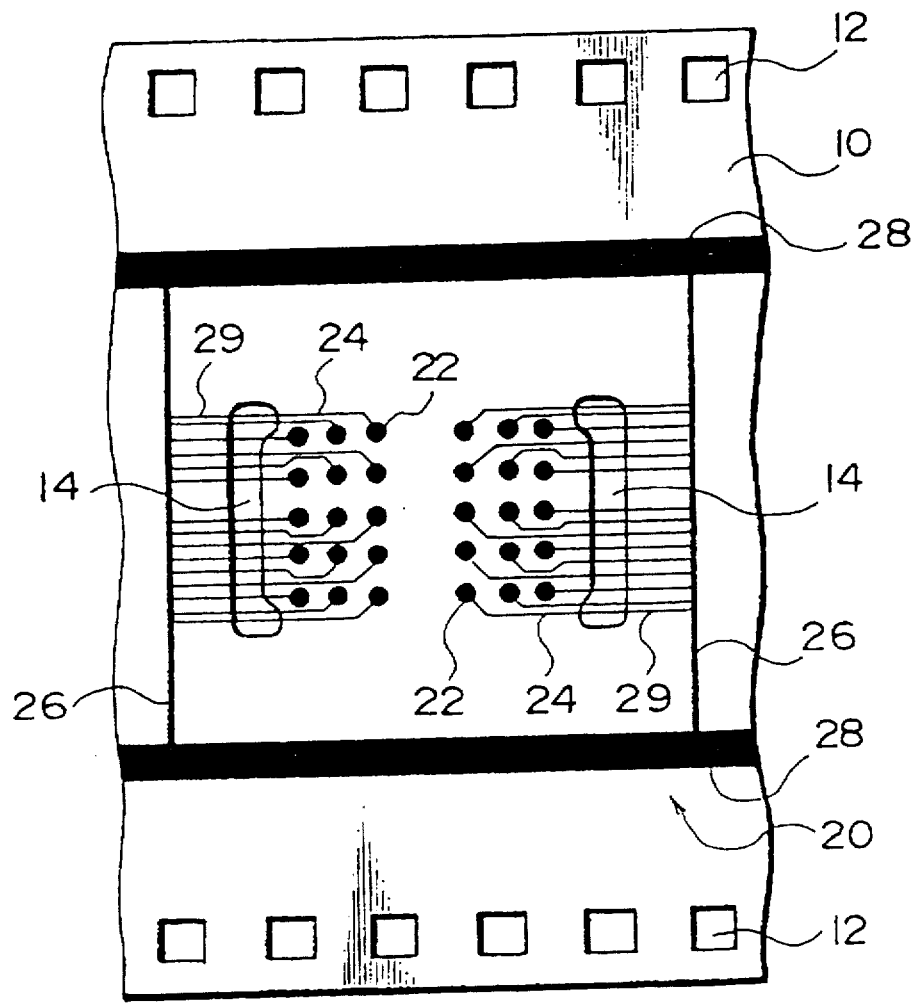
Figure 5:
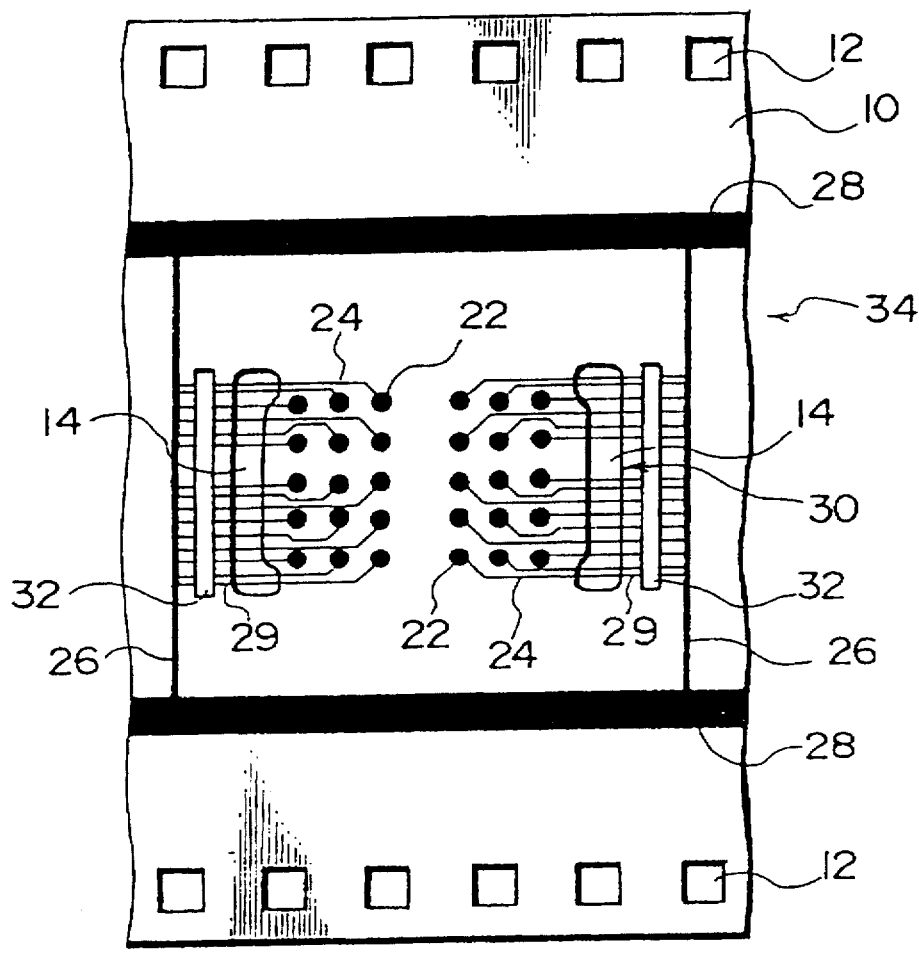
Figure 6:
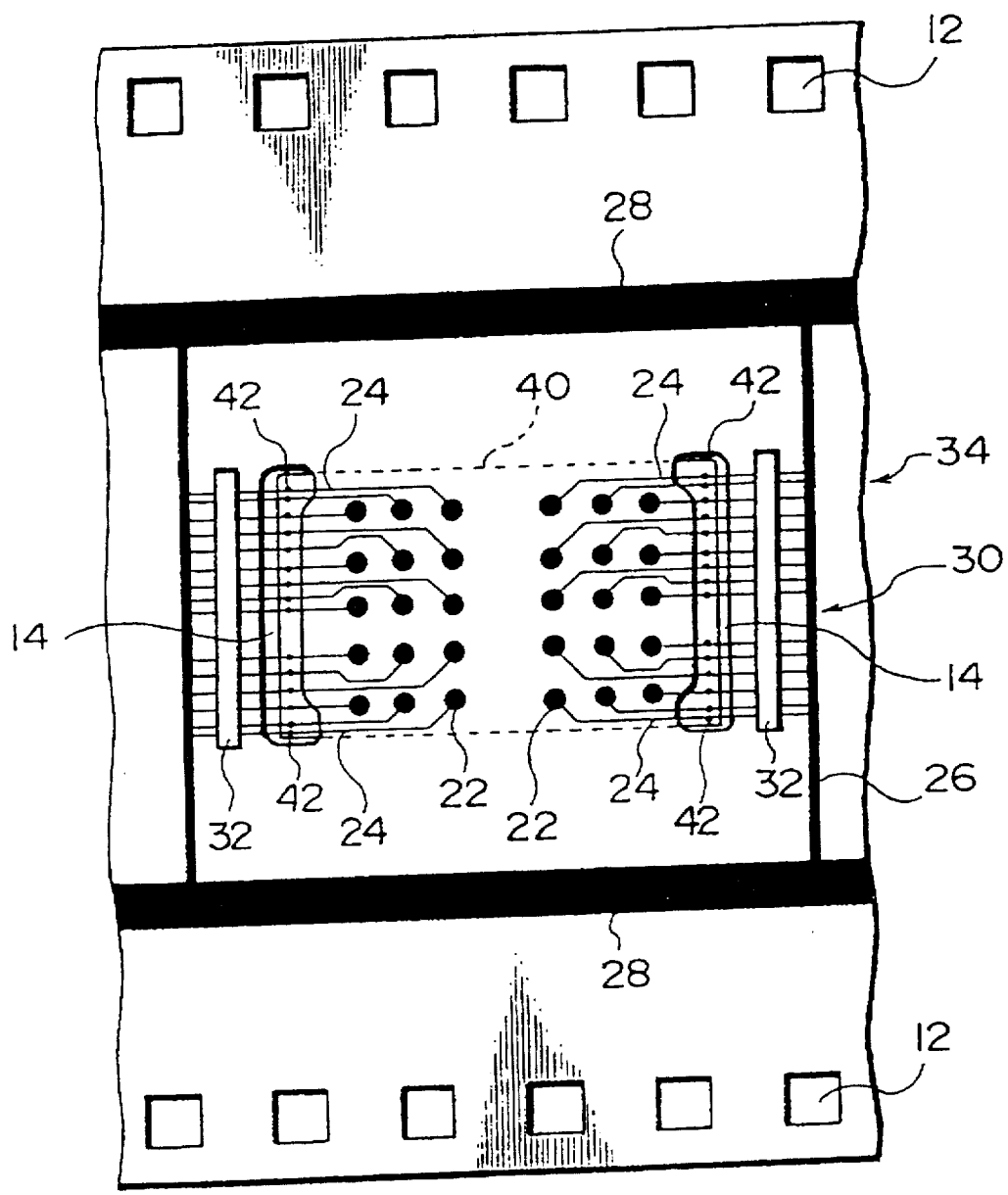
Figure 7:
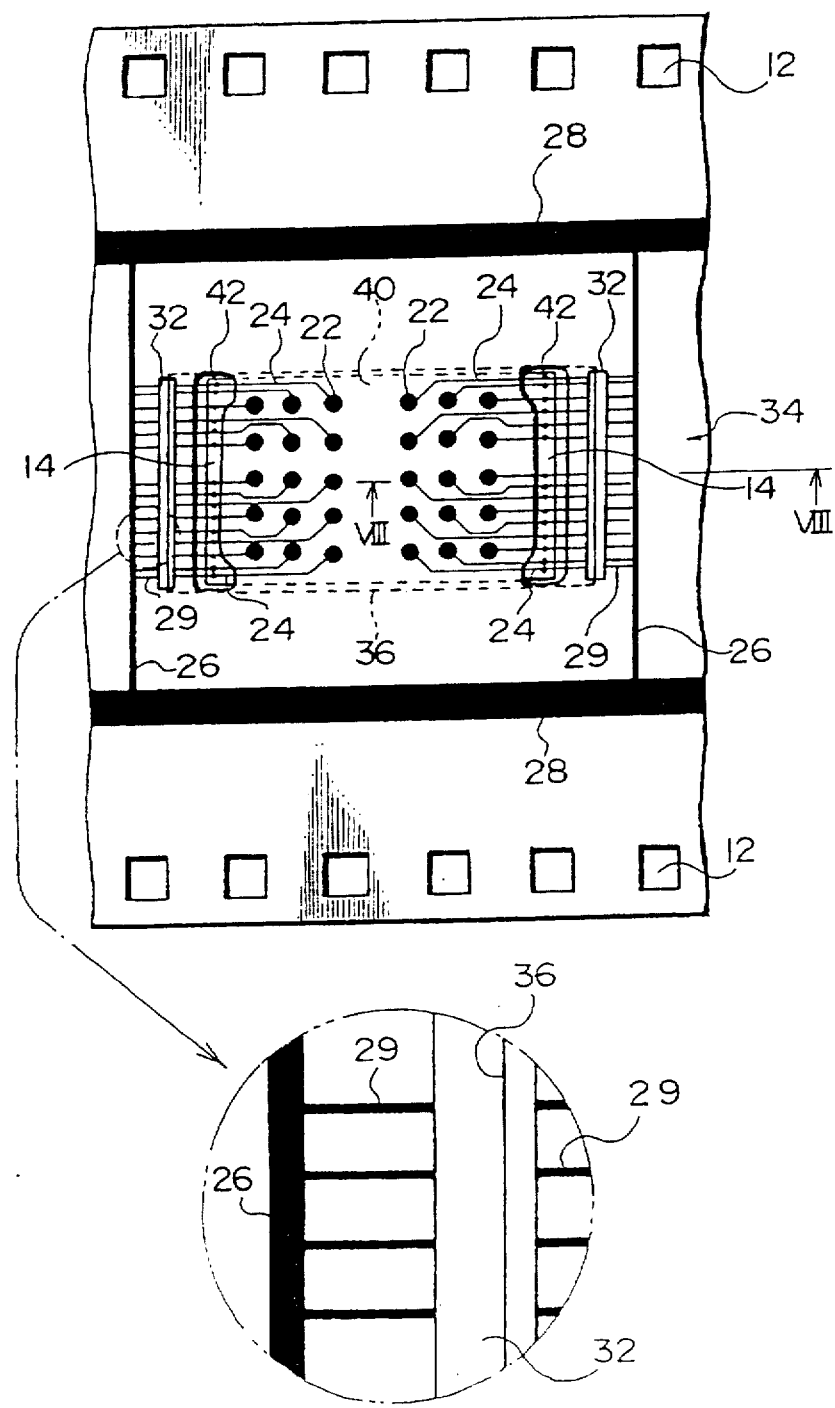

FIG. 11 shows a circuit board 100 on which a semiconductor device 110, made by applying the above embodiment, is mounted. Although not shown in detail in the figure, pad portions 22 of the semiconductor device 110 and connection portions (such as lands) formed on the circuit board 100 are electrically connected. Well-known solder, for example, is used as the connection material, which is designed to be interposed between both (the pad portions of the semiconductor device 110 and the connection portions of the circuit substrate 100), to connect them. Materials other than solder could be used as the connection material, such as an anisotropic conductive adhesive, or various other connection means could be used.

What is claimed is:

1. A method of making a resin-sealed type semiconductor device in which a flexible substrate having a plurality of connection leads is used, where one end portion of each of said connection leads is used for connection to one of electrodes of a semiconductor chip and the other end portion thereof is used for connection to an exterior, said method comprising:

a first step of positioning a part of a film carrier tape corresponding to said flexible substrate above said semiconductor chip, positioning said one end portion and said other end portion of each of said connection leads within a region of said semiconductor chip, and positioning said one end portion extended from said one of electrodes that is connected to said one end portion toward an outer periphery of said semiconductor chip;

a second step of connecting said one end portion of each of said connection leads to one of said electrode of said semiconductor chip, after said first step;

a third step of sealing in resin said part of said film carrier tape corresponding to said flexible substrate and said one end portion of each of said connection leads, except a region where external electrodes arranged in array on said flexible substrate, after said second step;

a fourth step of separating an individual piece from said film carrier tape, after said third step.

2. The method of making a semiconductor device as defined in claim 1, wherein said fourth step is performed outside a region sealed with said resin.

3. The method of making a semiconductor device as defined in claim 1, further comprising a step of forming said film carrier tape, before said first step.

4. The method of making a semiconductor device as defined in claim 3, wherein said step of forming said film carrier tape comprises:

a step of forming a conductive pattern on a film, said conductive pattern electrically comprising all of said connection leads, a plurality of connection portions, at least one plating lead and a plating electrode in an electrically conductive state, said connection leads being formed within said region to be sealed in said resin and electrically connecting said electrodes to said exterior, each of said connection portions being connected to one of said connection leads and extending to outside said resin-sealed region, said plating lead being connected to said connection portions outside said resin-sealed region, and said plating electrode being connected to said plating lead;

a step of performing electroplating on said conductive pattern, through said plating electrode; and a step of punching out at least part of each of said connection portions.

5. The method of making a semiconductor device as defined in claim 4, wherein said connection portions are punched out in a single batch.

6. The method of making a semiconductor device as defined in claim 4, wherein said connection portions are punched out in a single batch.

7. The method of making a semiconductor device as defined in claim 4, wherein said punching is performed for each of said connection portions.

8. The method of making a semiconductor device as defined in claim 4, wherein each of said connection portions is punched out to form a circular hole.

9. The method of making a semiconductor device as defined in claim 8, wherein said circular hole has an oval shape, such that a major-axial direction of said oval shape is aligned substantially perpendicular to a side forming an outer periphery of a semiconductor device.

10. The method of making a semiconductor device as defined in claim 4, wherein a protective film is provided on a region of said conductive pattern, before said step of executing plating, said region of said conductive pattern excluding a region to be subjected to said plating.

11. The method of making a semiconductor device as defined in claim 10, wherein a resin is used for said protective film.

12. The method of making a semiconductor device as defined in claim 11, wherein a solder resist is used for said resin.

13. A semiconductor device, comprising:

a semiconductor chip having a plurality of electrodes;

a flexible substrate positioned above said semiconductor chip, at a predetermined distance therefrom, and also overlaying said semiconductor chip;

resin positioned between said semiconductor chip and said flexible substrate, said resin sealing a surface of said semiconductor chip, said surface having said electrodes; and a plurality of connection leads on said flexible substrate, each of said connection leads having one end portion being connected to one of said electrodes of said semiconductor chip, and the other end portion being used for connection to the exterior, said one end portion being extended from said one of electrodes being connected to said one end portion toward an outer periphery of said semiconductor chip, and at least said one end portion of said connection leads being completely covered with said resin, except a region where external electrodes arranged in array on said flexible substrate.

14. The semiconductor device as defined in claim 13, wherein holes are formed in said flexible substrate, each of said holes are positioned where said one of end portions of said connection leads which is completely covered with said resin are positioned, each of said holes having one of a circular shape and an oval shape.

15. The semiconductor device as defined in claim 13, wherein said one end portion of said connection leads is extended to a side surface portion of said flexible substrate, and said resin is extended to said side surface portion of the flexible substrate and said one end portion of said connection leads.

16. The semiconductor device as defined in claim 13, wherein said resin is extended to a side surface portion of said semiconductor chip.

17. A semiconductor device, comprising:

a semiconductor chip having a plurality of electrodes;

a flexible substrate positioned above said semiconductor chip, at a predetermined distance therefrom, and also overlaying said semiconductor chip;

resin positioned between said semiconductor chip and said flexible substrate, said resin sealing a surface of said semiconductor chip, said surface having said electrodes; and a plurality of connection leads on said flexible substrate, each of said connection leads having one end portion being connected to one of said electrodes of said semiconductor chip and the other end portion being used for connection to the exterior, at least a point portion of said one end portion being positioned closer to a side portion of said semiconductor device than said one of electrodes being connected to said one end portion, and said point portion of said one end portion being covered with said resin to make said point portion non-exposing.

* * * * *

UNITED STATES PATENT AND TRADEMARK OFFICE
CERTIFICATE OF CORRECTION

PATENT NO. : 6,274,405 B1
DATED : August 14, 2001
INVENTOR(S) : Nobuaki Hashimoto It is certified that error appears in the above-identified patent and that said Letters Patent is hereby corrected as shown below:

<u>Drawings,</u>
Please replace Figues 4-7 with the attached Figures.

Signed and Sealed this

Nineteenth Day of March, 2002

Attest:

JAMES E. ROGAN
*Director of the United States Patent and Trademark Office*

*Attesting Officer*